United States Patent
del Puerto

(10) Patent No.: US 7,163,301 B2
(45) Date of Patent: *Jan. 16, 2007

(54) METHOD AND APPARATUS FOR MANAGING ACTINIC INTENSITY TRANSIENTS IN A LITHOGRAPHY MIRROR

(75) Inventor: Santiago del Puerto, Milton, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/169,009

(22) Filed: Jun. 29, 2005

(65) Prior Publication Data

US 2005/0254154 A1    Nov. 17, 2005

Related U.S. Application Data

(63) Continuation of application No. 10/170,546, filed on Jun. 14, 2002, now Pat. No. 6,994,444.

(51) Int. Cl.
  G02B 5/08    (2006.01)
  G02B 7/182   (2006.01)
  H05B 3/00    (2006.01)

(52) U.S. Cl. ............ 359/846; 359/848; 359/883; 219/219; 219/476; 219/483; 374/179

(58) Field of Classification Search ........... 359/507, 359/512, 846, 848, 883; 219/219, 476, 477, 219/482, 483; 374/130, 132, 179
See application file for complete search history.

(56) References Cited

U.S. PATENT DOCUMENTS

| | | | |
|---|---|---|---|
| 3,686,473 A | 8/1972 | Shim et al. | |
| 4,253,739 A | 3/1981 | Carlson | |
| 4,422,725 A | 12/1983 | Prewo | |
| 4,540,251 A * | 9/1985 | Yau et al. | 359/846 |
| 5,904,874 A * | 5/1999 | Winter | 219/544 |
| 5,990,449 A * | 11/1999 | Sugiyama et al. | 219/219 |
| 6,634,760 B1 | 10/2003 | Folta et al. | |
| 6,994,444 B1 * | 2/2006 | del Puerto | 359/883 |

FOREIGN PATENT DOCUMENTS

DE        2908167    *  9/1980

(Continued)

OTHER PUBLICATIONS

European Search Report for European Patent Application No. 03013654.3, dated Oct. 14, 2003, 4 pages.

(Continued)

Primary Examiner—Ricky D. Shafer
(74) Attorney, Agent, or Firm—Sterne, Kessler, Goldstein & Fox P.L.L.C.

(57) ABSTRACT

An apparatus and method for mitigating a cold edge effect within a lithography mirror is presented. The apparatus includes a heated annular zone formed on a substrate and a heated optical aperture zone formed on the heated annular zone, where each zone includes a resistive layer, and where the resistive layer of at least one zone is produced such that electrical conductivity varies by increasing from the center of the resistive layer to the periphery of the resistive layer. A wiring layer in each zone includes an insulating sublayer and contacts for coupling to a power supply. A time-constant heat load on the lithography mirror is maintained by placing additional electrical heat loads on the mirror according to the actinic heat load on the mirror. Maintaining the time-constant heat load can reduce or eliminate variation in image distortion that occurs as a result of changes in the actinic heat load.

11 Claims, 8 Drawing Sheets

FOREIGN PATENT DOCUMENTS

| | | |
|---|---|---|
| DE | DD 290 722 A5 | 6/1991 |
| JP | 63-161403 * | 7/1988 |
| WO | WO 96/05637 | 2/1996 |

OTHER PUBLICATIONS

Sato, S., et al., "High heat load vacuum ultraviolet mirror development in Japan," Optical Engineering, 34(2):377-386 (Feb. 1995).

*Temperature Sensors, Instruments, Flexible Heaters, and Flex-Circuits from Minco*, from http://www.minco.com, Minco Products, Inc., 4 pages (Dec. 2001).

English language abstract of German Patent No. DD 290 722, issued Jun. 6, 1991, 3 pages.

* cited by examiner

METHOD AND APPARATUS FOR MANAGING ACTINIC INTENSITY TRANSIENTS IN A LITHOGRAPHY MIRROR

CROSS-REFERENCE TO RELATED APPLICATIONS

This application is a continuation of U.S. patent application Ser. No. 10/170,546, filed Jun. 14, 2002, now U.S. Pat. No. 6,994,444, which is herein incorporated by reference in its entirety.

BACKGROUND OF THE INVENTION

1. Field of the Invention

The present invention relates generally to lithography systems. More particularly, the present invention relates to management of actinic heat load on mirrors in lithography systems.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage, is exposed to an image projected onto the surface of the wafer by an exposure system located within a lithography system. The exposure system includes a reticle (also called a mask) for projecting the image onto the wafer.

The reticle is generally located between a semiconductor chip and a light source. In photolithography, the reticle is used as a photo mask for printing a circuit on a semiconductor chip, for example. Lithography light shines through the mask and then through a series of optical lenses that shrink the image. This small image is then projected onto the silicon or semiconductor wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be etched onto the silicon wafer. A silicon wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lens can be replaced by a mirror. Although the mirror reflects a large percentage of the light, a fair amount of the light is absorbed by the mirror. The absorbed actinic light (i.e., energy generated from a light source such as an optical light source in a lithography tool) causes heat load on the mirror. Too much heat can result in image distortion on the wafer. Further, if heat load on the mirror is not maintained at a relatively constant level, variation in the amount of image distortion can occur. Thus, there is a need to control actinic heat load (e.g., by measuring mirror temperature) on the mirror caused by the absorbed light.

The temperature of the mirror should be controlled such that the temperature is maintained constant over time. Conventional mirror temperature control techniques attempt to maintain a time-constant mirror temperature by varying the rate of heat removal from the non-optical surfaces of the mirror with a temperature servo. A typical mirror is relatively large and has a high thermal mass with low thermal conductivity. Due to the two above mentioned characteristics of the typical mirror in a lithography projection system, this conventional "control-by-heat-removal" method can be ineffective in environments with transient actinic heat loads. For example, in applications such as EUV photolithography of integrated circuits, the actinic heat load is transient (e.g., changes every time a reticle is exchanged). The actinic heat load changes faster than the temperature control servo's ability to follow. As a result, the temperature of the mirror is not maintained at a constant over time and variation in distortion of the projected image occurs.

The problem of image distortion variation resulting from failure to maintain a time-constant and spatially-constant heat load on the mirror is further exacerbated by a phenomenon known as "the cold edge effect." The cold edge effect is caused by the variation of actinic heat load on the optical aperture of the mirror and the annular area (i.e., the non-illuminated area of the mirror located beyond the optical aperture). A lithography mirror typically has a lower temperature at the annular area than it has at the optical aperture.

Therefore, what is needed is an apparatus and method for fabricating a mirror and for managing heat load on the mirror such that variation in image distortion from variation of heat on the mirror is minimized. Such an apparatus and method should maintain a time-constant total heat load during transients of illumination incident on the projection mirror (i.e., during times of change of actinic heat load on the mirror). Further, such an apparatus and method should also maintain a spatially constant total heat load on the mirror to mitigate the cold edge effect.

BRIEF SUMMARY OF THE INVENTION

An apparatus and method for mitigating a cold edge effect within a lithography mirror is presented. The apparatus includes a heated annular zone formed on a substrate and a heated optical aperture zone formed on the heated annular zone, where each zone includes a resistive layer, and where the resistive layer of at least one zone is produced such that electrical conductivity of the resistive layer varies by increasing from the center of the resistive layer to the periphery of the resistive layer. A wiring layer in each zone includes an insulating sublayer and contacts for coupling to a power supply. A time-constant heat load on the lithography mirror is maintained by placing additional electrical heat loads on the mirror as needed. A desired time-constant heat load on the lithography mirror is determined based on the amount of actinic heat reflected onto the mirror by one of the most reflective masks with a heat reflection capability unsurpassed by any of the other masks in a set of masks. When one of the less reflective masks is being used, additional heat is applied to the mirror to achieve the desired time-constant heat load on the mirror. A method for manufacturing the apparatus is also presented.

Maintaining the desired time-constant heat load on the mirror can reduce or eliminate variation in image distortion that occurs as a result of changes in actinic heat load on the lithography mirror. To mitigate the cold edge effect, the mirror is divided into one or more zones with independent temperature control. This allows a constant additional heat load to be applied to a first zone while allowing the temperature in a second zone to be inversely modulated according to actinic heat load on the projection mirror. The flexibility of independent temperature control also allows a spatially constant total heat load.

BRIEF DESCRIPTION OF THE FIGURES

The accompanying drawings, which are incorporated herein and form part of the specification, illustrate the present invention and together with the description further serve to explain the principles of the invention and to enable a person skilled in the relevant art(s) to make and use the invention.

DETAILED DESCRIPTION OF THE INVENTION

Figure 1:
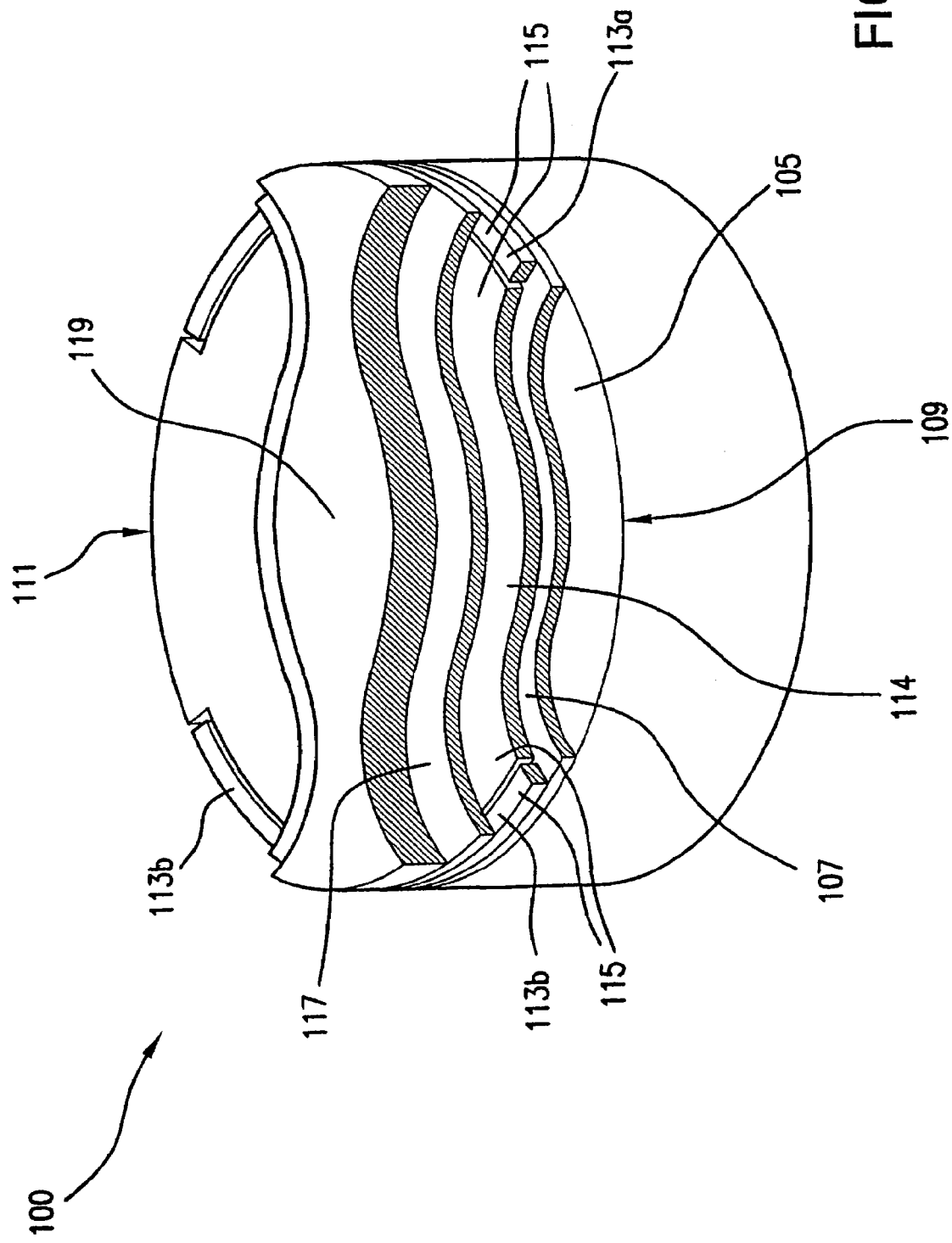
FIG. 1 is an illustration of layers and components of a lithography mirror according to the present invention.

FIG. 1 illustrates a cross-sectional view of various layers and components of a lithography mirror 100 according to the present invention. Lithography mirror 100 is composed of a mirror blank substrate 105, a resistive layer 107, a front edge 109, a rear edge 111, contacts 113 (e.g., electrodes) formed on resistive layer 107 for coupling a power supply (shown in FIG. 4) to resistive layer 107, a wiring layer 115, a polished layer 117, and a reflective layer 119.

Mirror blank substrate 105 is typically made of glass (e.g., low expansion glass, silicon, or quartz) and has a diameter-to-thickness ratio of approximately three to five. Mirror blank substrate 105 represents the basic structure of lithography mirror 100. The substrate should be machined and polished and have a near-zero Coefficient of Thermal Expansion (CTE), in accordance with standard industry practices. CTE is a thermodynamics term used to refer to the amount of increase in size of a solid object that occurs because of an increase in temperature. The term is well known to those skilled in the relevant art(s) and will therefore not be described further herein.

Resistive layer 107 is the first layer of lithography mirror 100. Resistive layer 107 can be an electrically resistive layer or film. It should be noted that resistive layer 107 should be applied to an active side of lithography mirror 100 (i.e., the reflective side of lithography mirror 100). Resistive layer 107 dissipates power as heat in lithography mirror 100. Resistive layer 107 can have a low, medium, or high resistance. Depending upon a desired value of resistance, resistive layer 107 can be made of Carbon, Nichrome, some mixture of ceramic and metal (cermet), or any other viable material(s) known to those skilled in the relevant art(s).

To vary electrical conductivity in resistive layer 107, its thickness can be varied to allow the center of the film to produce more heat than the periphery of the film. This type of variation can provide an optimal accommodation for the distribution of incident actinic power or heat within the optical aperture of lithography mirror 100.

Resistive layer 107 can be produced by doping a semiconductor film (e.g., arsenic-doped silicon) to vary its electrical conductivity. If resistive layer 107 is doped, the amount of dopant concentration can be varied to allow the center of resistive layer 107 to produce more heat than the periphery. The variation of the amount of dopant concentration on resistive layer 107 can allow optimal accommodation for the distribution of incident actinic power within the optical aperture of lithography mirror 100.

Wiring layer 115 is the second layer of lithography mirror 100. Wiring layer 115 includes contacts 113 and insulating sublayer 114. Wiring layer 115 will be further described in FIG. 2B.

Polished layer 117 is the third layer of lithography mirror 100. Polished layer 117 should be polished to final figure, as is well known to those skilled in the relevant art(s). For example, the deviation between the actual polished surface achieved in the mirror compared to the ideal polished surface of the mirror should be less than one nanometer. Polished layer 117 is made of any viable polishable material known to those skilled in the relevant art(s). It should be noted that if polished layer 117 is composed of conductive material, an insulating layer should be added between wiring layer 115 and polished layer 117 to prevent short-circuiting. Alternatively, the insulating layer itself can be polished and substituted for the polished layer.

Reflective layer 119 is the fourth layer of lithography mirror 100. Reflective layer 119 provides lithography mirror 100 of the present invention with its reflectiveness characteristic. Reflective layer 119 is made of any viable material known to those skilled in the relevant art(s) for fabricating lithography mirrors. For example, in an EUV mirror, reflective layer 119 can be made of a molybdenum-silicon multilayer.

It should be noted that thickness of the various layers of lithography mirror 100 of the present invention has been exaggerated for illustrative purposes. The actual thickness of each layer can vary from less than one micron to a few microns. For example, the thickness of reflective layer 119 can be a fraction of a micron.

Figure 2A:
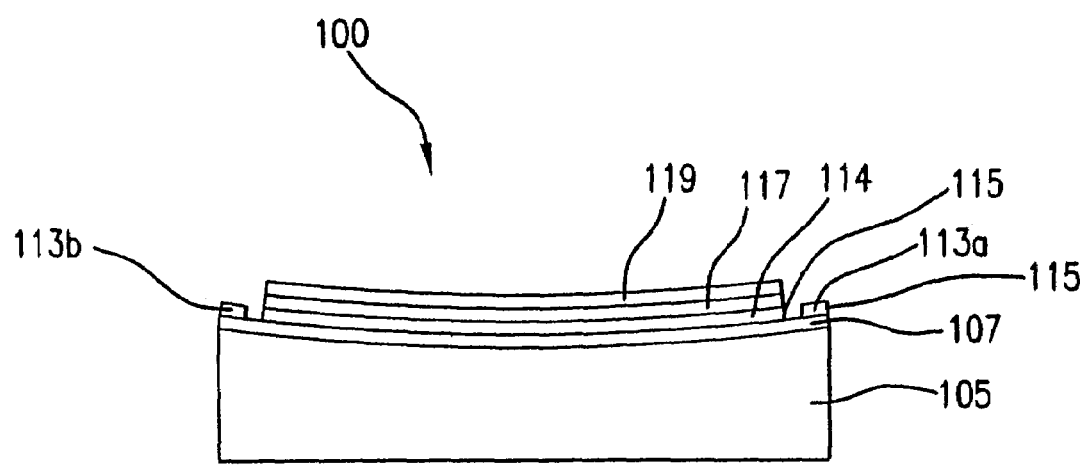
FIG. 2A is a side view of layers of a lithography mirror according to the present invention.

FIG. 2A illustrates a side view of the layers and components of lithography mirror 100 (shown in FIG. 1).

Figure 2B:
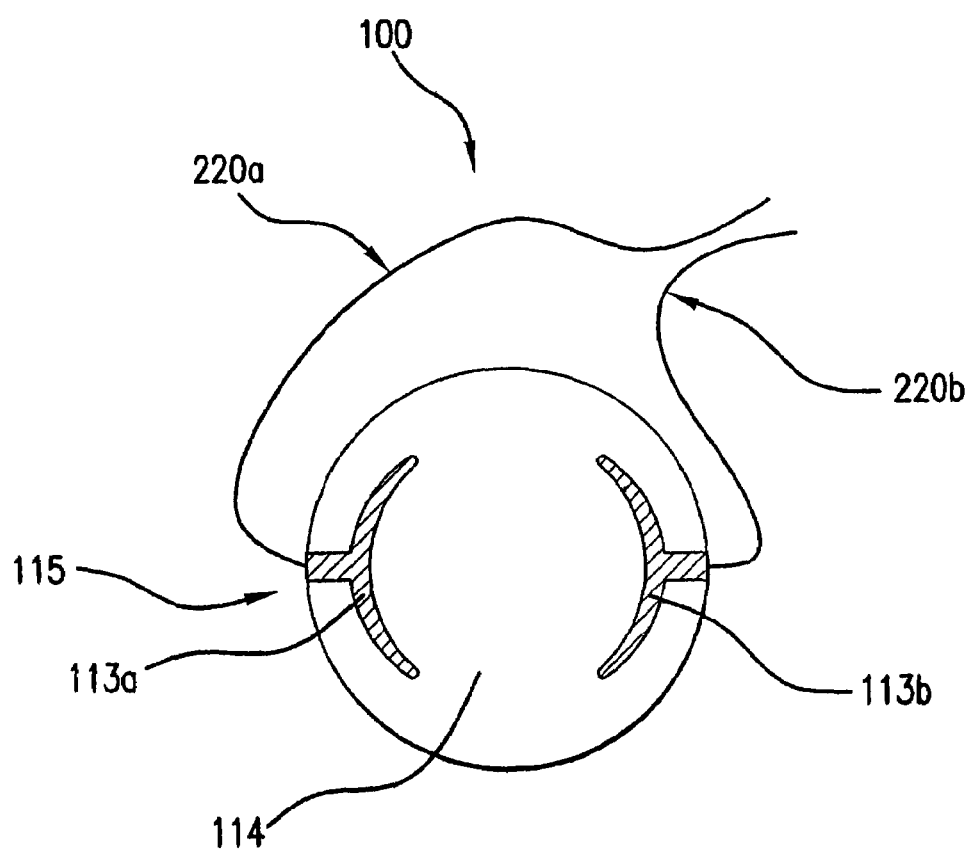
FIG. 2B is an illustration of the wiring layer of FIG. 2A.

FIG. 2B illustrates wiring layer 115 of lithography mirror 100. Wiring layer 115 comprises contacts 113a and 113b (generally designated as contacts 113) and insulating sublayer 114. Contacts 113 (e.g., electrodes or other equivalents) are made of copper or any other suitable conductive material. Contacts 113 couple to a power supply via wires 220a and 220b. This allows the power supply to disperse heat in resistive layer 107 (which lies below wiring layer 115). Contacts 113 should be spaced such that they provide optimal uniform dispersion of heat in lithography mirror 100. For example, the contact(s) can be diametrically opposed to one another.

Insulating sublayer 114 covers resistive layer 107. Insulating sublayer 114 is made of a dielectric material that reduces the possibility of the occurrence of short circuits in lithography mirror 100 of the present invention. For example, insulating sublayer 114 can be a nonconductive material such as polymer. Insulating sublayer 114 can also be made of silicon dioxide or any other viable insulating material(s) known to those skilled in the relevant art(s) for insulating. Insulating sublayer 114 should be of approximately the same thickness (e.g., less than one micron) as contacts 113 to allow wiring layer 115 to be relatively flat.

Figure 2C:
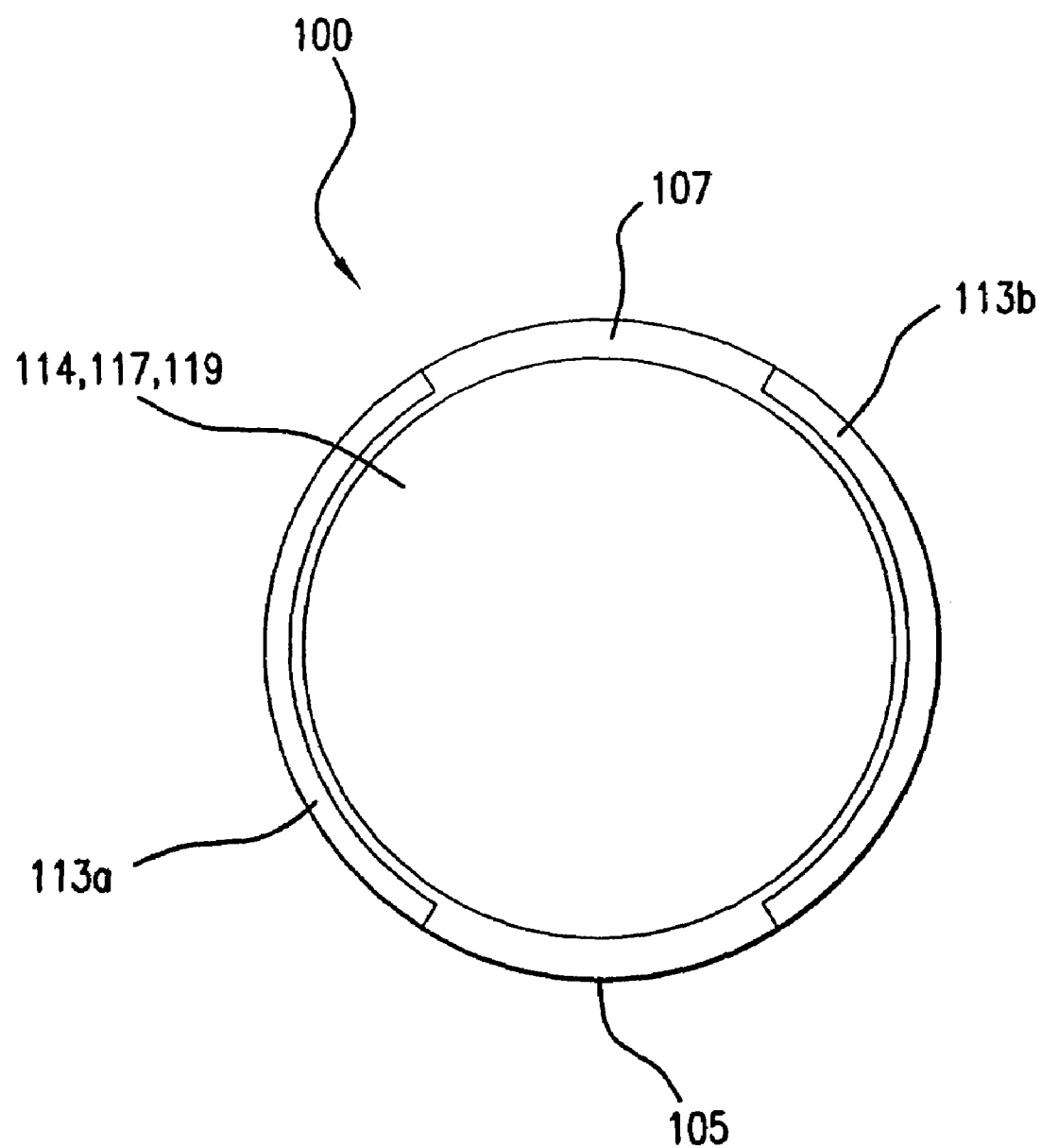
FIG. 2C is a top view of layers and components of the lithography mirror depicted in FIG. 1.

FIG. 2C illustrates a top view of the layers and components of lithography mirror 100.

Figure 3:
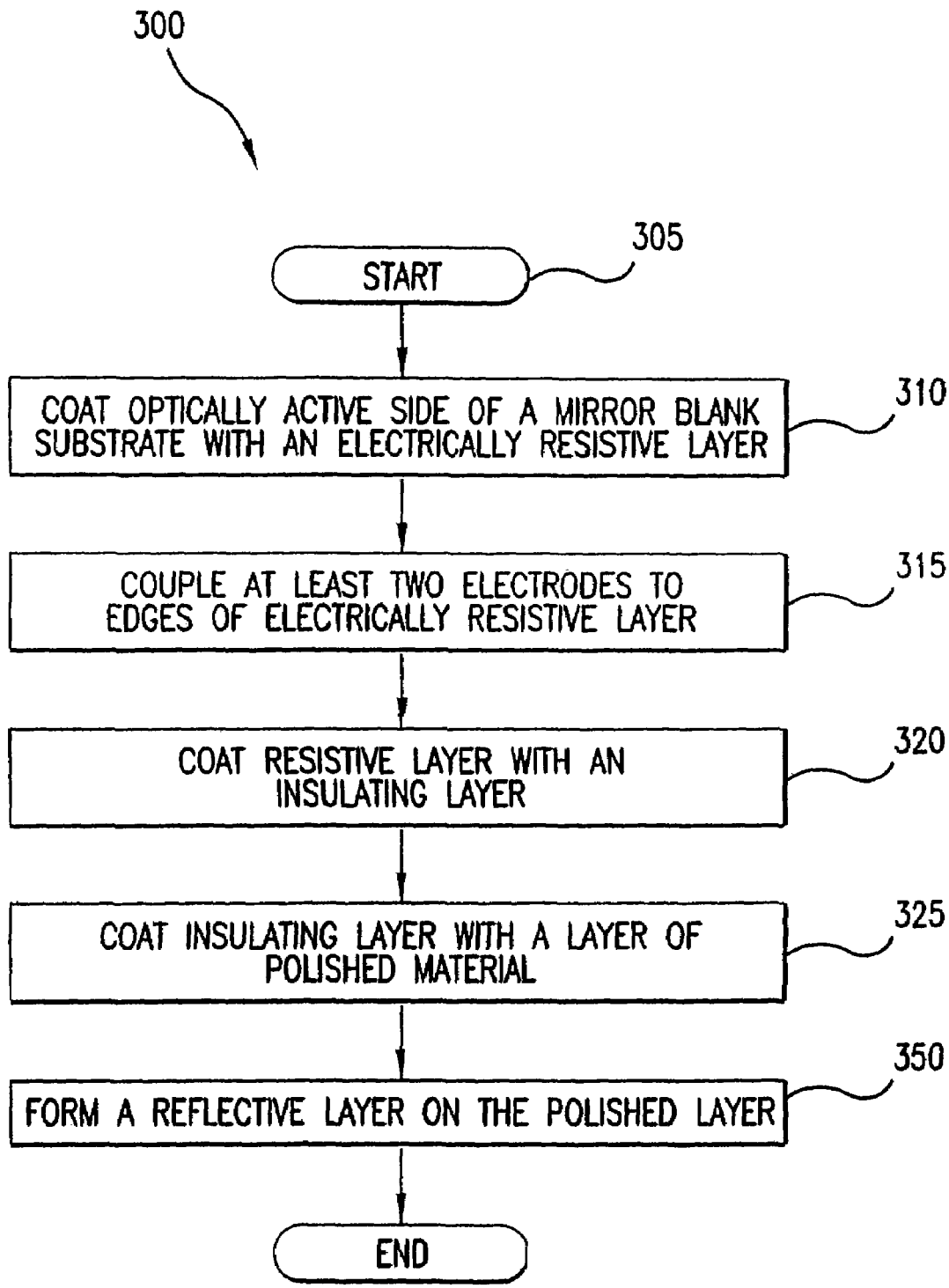
FIG. 3 is a flow diagram of the steps involved in manufacturing a lithography mirror according to the present invention.

FIG. 3 is a flow diagram 300 illustrating the steps involved in manufacturing a lithography mirror according to the present invention. The process begins with step 305, and immediately proceeds to step 310.

In step 310, resistive layer 107 is formed on the optically active side (i.e., the reflective side) of mirror blank substrate 105. As described above, resistive layer 107 can be made of any material suitable for providing electrical resistance.

In step 315, one or more contacts such as electrodes are coupled to an edge(s) of resistive layer 107.

In step 320, insulating layer 114 is formed on resistive layer 107 to reduce the possibility of the occurrence of short circuits in lithography mirror 100.

In step 325, a layer of polished material is formed on insulating layer 114 to form polished layer 117 (shown in FIG. 1). As mentioned above, polished layer 117 can be made of any viable polished material known to those skilled in the relevant art(s).

In step 350, reflective layer 119 is formed on polished layer 117. Reflective layer 119 provides lithography mirror 100 with its reflectiveness characteristic.

Figure 4:
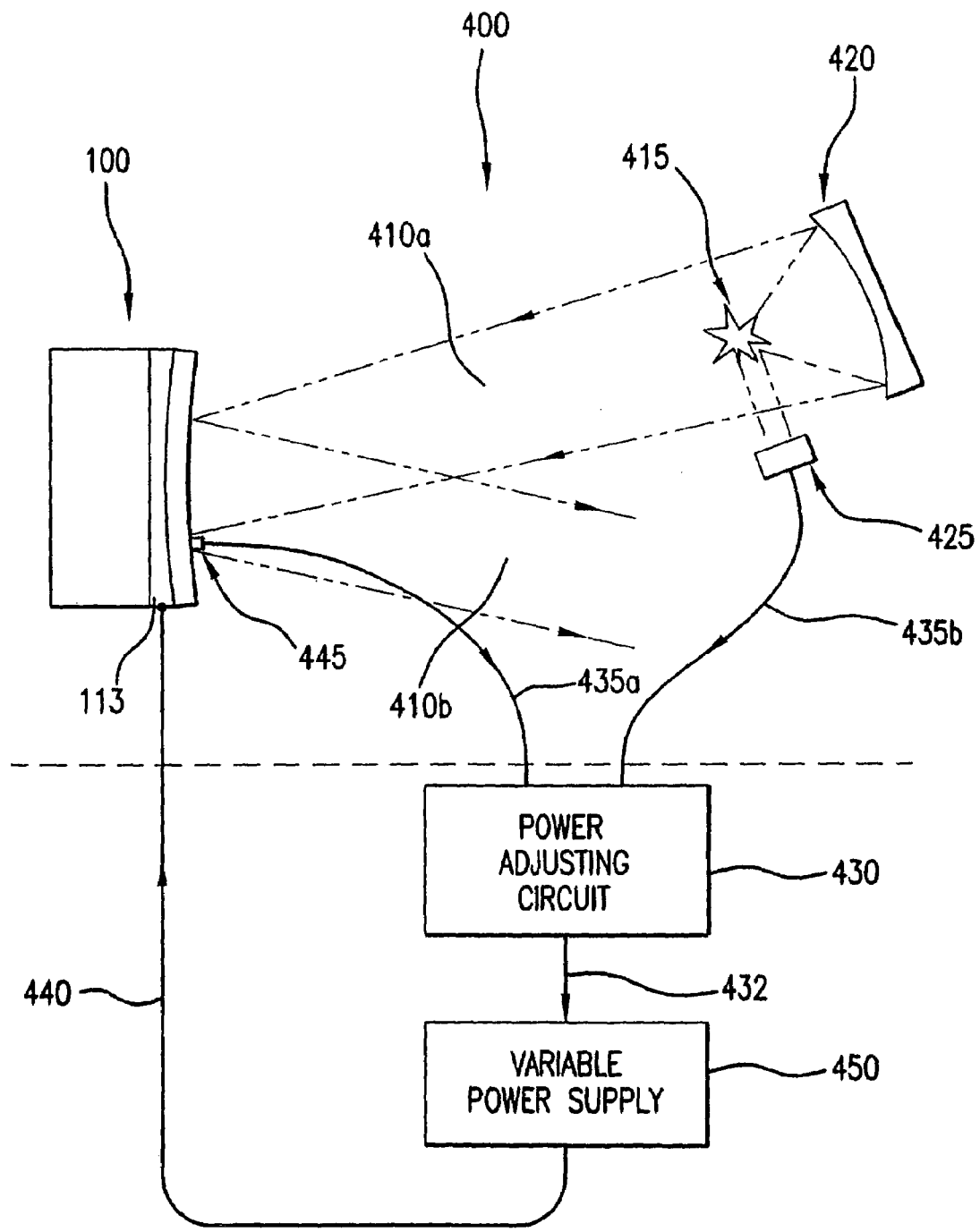
FIG. 4 is an illustration of a lithography illumination system in which the lithography mirror of the present invention is shown as a condenser mirror.

FIG. 4 illustrates a lithography illumination system 400 depicting lithography mirror 100 acting as a lithography condenser mirror. FIG. 4 illustrates a situation in which an actinic light source is varied. For example, a lithography tool user can increase or decrease the actinic light intensity being produced by the actinic light source in such a situation. Lithography illumination system 400 represents the illuminator portion of a lithography tool (i.e., transmission of EUV light before it is projected onto the reticle or mask stage).

Lithography illumination system 400 comprises collector mirror 420, EUV light source 415, lithography mirror 100, mirror temperature sensor 445, actinic light intensity sensor 425, power adjusting circuit 430, and variable power supply 450. Collector mirror 420 reflects light from EUV light source 415 onto lithography mirror 100. EUV light source 415 can be a three-dimensional beam of light reflected from collector mirror 420 to lithography mirror 100.

A light beam 410a is a beam of actinic light being transmitted from EUV light source 415 to lithography mirror 100. Light beam 410b is a beam of actinic light reflected from lithography mirror 100 to a reticle stage (not shown in FIG. 4), for example.

In FIG. 4, lithography mirror 100 acts as a condenser mirror. Its fundamental operation (i.e., how it reflects light) is well known to those skilled in the relevant art(s). Lithography mirror 100 is composed of the same layers as indicated in FIG. 1. In addition to the layers previously described, however, lithography mirror 100 further comprises mirror temperature sensor 445.

Mirror temperature sensor 445 measures the temperature in lithography projection mirror 100. Mirror temperature sensor 445 acts as a feedback means, thereby transmitting a voltage signal that is roughly proportional to the temperature of the sensor itself to power adjusting circuit 430 to cause power applied to lithography mirror 100 to be increased or decreased. For example, mirror temperature sensor 445 can be at least one infrared detector to monitor a front surface of lithography projection mirror 100.

Mirror temperature sensor 445 can also be a thermocouple that is attached to the front surface of lithography mirror 100. The term thermocouple is used herein to refer to a single thermocouple, a thermistor, a resistive temperature detector, or any combination of these elements. Mirror temperature sensor 445 should be positioned so as to not impede reflection of actinic light beam 410a. Mirror temperature sensor 445 should also be placed as close as possible to a position where the light impinges on and heats lithography mirror 100. Further, those skilled in the relevant art(s) would recognize that any other type of sensor or detector (or combination thereof) can be employed without departing from the spirit and scope of the present invention.

Mirror temperature sensor 445 can be coupled to power adjusting circuit 430 via an energy channel 435a. Energy channel 435a can be any viable channel for transferring electricity. A first end of energy channel 435a connects to power adjusting circuit 430. A second end of energy channel 435a connects to mirror temperature sensor 445 on lithography mirror 100, as illustrated in FIG. 4.

Actinic light intensity sensor 425 measures actinic light reflected from collector mirror 420 onto lithography mirror 100. Actinic light intensity sensor 425 acts as a feedforward means, thereby providing a signal to power adjusting circuit 430 which causes variable power supply 450 to increase or decrease electrical power to the resistive film in the mirror inversely to the amount of reflected actinic light sensed. Actinic light intensity sensor 425 can be composed of a heat flux sensor or a photocell capable of producing an electrical voltage that is proportional to the intensity of the light incident on the heat flux sensor or photocell.

Actinic light intensity sensor 425 is also coupled to power adjusting circuit 430 via an energy channel 435b, such as a conductive wire. For example, a first end of energy channel 435b connects to power adjusting circuit 430. A second end of energy channel 435b connects to actinic light intensity sensor 425.

Although actinic light intensity sensor 425 can be employed in combination with mirror temperature sensor 445, either one or the other can be utilized alone. Employing both actinic light intensity sensor 425 and mirror temperature sensor 445, however, can improve performance of lithography illumination system 400 by providing a more accurate overall measurement.

Power adjusting circuit 430 reacts to input signals from mirror temperature sensor 445 and actinic light intensity sensor 425 by changing a command signal to variable power supply 450. For example, when power adjusting circuit 430 detects a change in the signal from actinic light intensity sensor 425 or mirror temperature sensor 445, it commands variable power supply 450 to inversely change the power sent to contacts 113 on resistive layer 107. Power adjusting circuit 430 can be located in a remote electronics cabinet of lithography illumination system 400.

Variable power supply 450 provides power to contacts 113, thereby dissipating heat in resistive layer 107 (shown in FIG. 1). Variable power supply 450 can act as a variable resistor to vary the amount of electrically generated heat load dissipated in resistive layer 107 in lithography mirror 100 inversely to the amount of actinic heat load on lithography mirror 100, as measured by actinic light intensity sensor 425, according to the following equation:

$$TH=C=AH+EH,$$

wherein TH is total heat load on the lithography mirror,
C is some time-constant power,
AH is actinic heat load on the lithography mirror, and
EH is electrical heat load on the lithography mirror.

Therefore, the amount of electrical heat load needed to maintain a time-constant temperature can be represented by the following equation: EH=C−AH. When an appropriate amount of electrical heat load is inversely applied (by variable power supply 450) to lithography mirror 100 according to actinic light reflected onto the mirror (as measured by actinic light intensity sensor 425), variation in image distortion in lithography illumination system 400 can be reduced or eliminated.

Variable power supply 450 can be coupled to power adjusting circuit 430 via an energy channel 432, as would be known to one skilled in the relevant art(s). Variable power supply 450 can be coupled to contacts 113 of lithography mirror 100 via an energy channel 440, similar to the connection described above. Variable power supply 450 can be a Direct Current (DC) or an Alternating Current (AC) type of power supply, as would be known to those skilled in the relevant art. Variable power supply 450 can be located in a remote electronics cabinet of lithography illumination system 400.

Figure 5:
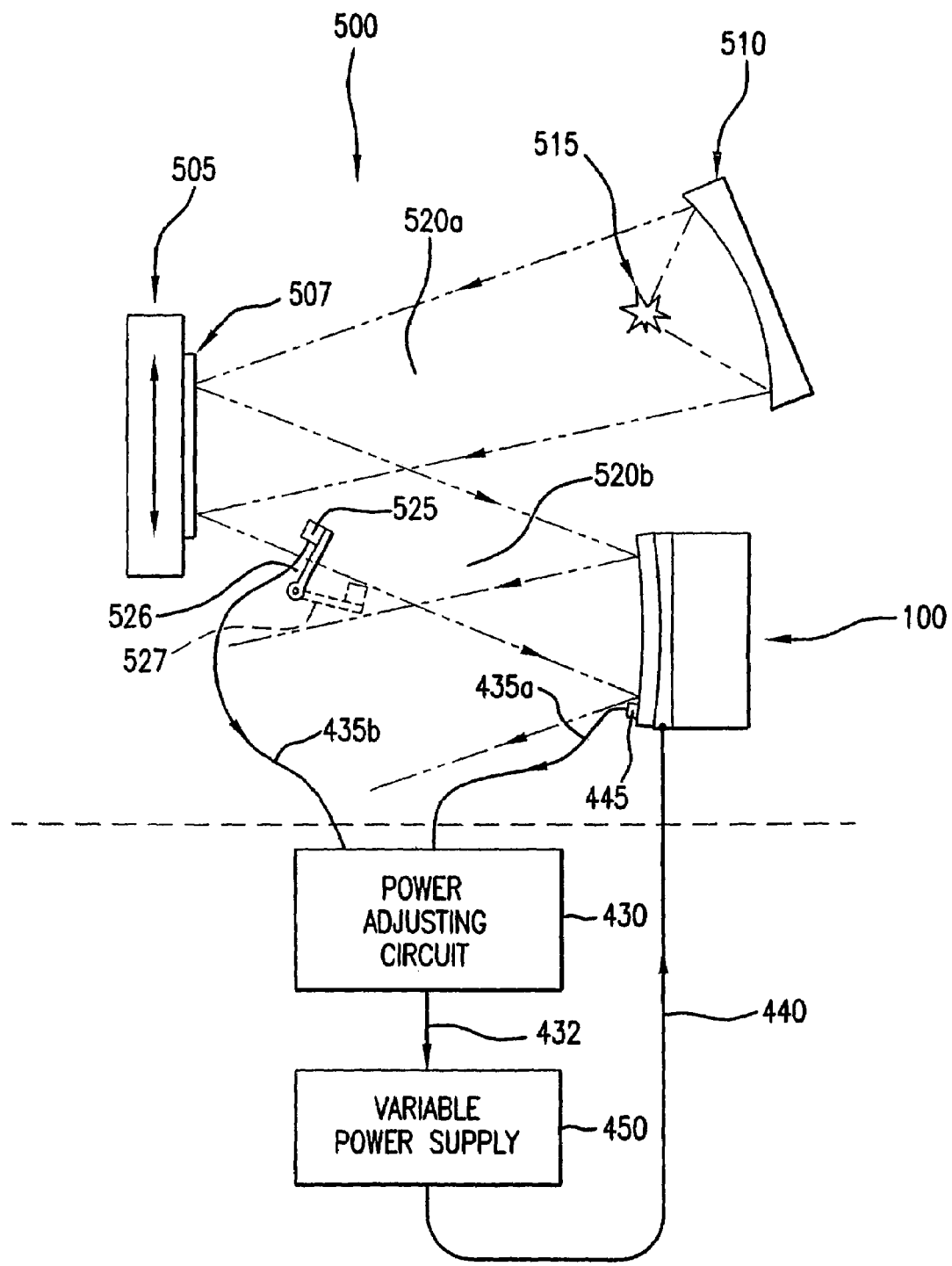
FIG. 5 is an illustration of a lithography projection system in which the lithography mirror of the present invention is shown as a projection optics mirror.

FIG. 5 is an illustration of a lithography projection optics system 500 depicting lithography mirror 100 acting as a lithography projection optics mirror. FIG. 5 illustrates a situation in which an actinic light source remains the same. In FIG. 5, however, changing of masks with various reflectivity capabilities causes a variation in actinic light reflected onto lithography mirror 100. Lithography projection optics system 500 represents the projection optics portion of a lithography tool (i.e., after reflection of EUV light onto the reticle or mask stage).

Lithography projection optics system 500 comprises mask stage 505, mask 507, illuminator mirror 510, EUV light source 515, actinic light beams 520a and 520b, lithography mirror 100, actinic light intensity sensor 525, power adjusting circuit 430, mirror temperature sensor 445, and variable power supply 450.

Mask stage 505 is a standard mask stage used in a lithography projection tool, as would be known to one skilled in the relevant art(s). Mask stage 505 holds mask 507, which is used to etch an image onto a wafer. Illuminator mirror 510 reflects actinic light beam 520a from EUV light source 515. Illuminator mirror 510 comprises collector and condenser mirrors, for example. These devices are well known in the relevant art(s) and will not be described further herein.

Actinic light beam 520a is an actinic beam of light reflected from illuminator mirror 510 to mask stage 505. Actinic light beam 520b is an actinic beam of light reflected from mask stage 505 to lithography mirror 100, as would be apparent to one skilled in the relevant art(s).

Actinic light intensity sensor 525 operates similar to actinic light intensity sensor 425 (shown in FIG. 4). But unlike actinic light intensity sensor 425, actinic light intensity sensor 525 can be rotated, as will be described below. As mentioned above, EUV light source 515 remains constant (i.e., transmits an amount of actinic light that remains constant over time). When actinic light beam 520a is reflected by mask 507 on mask stage 505, however, a change in actinic light intensity reflected onto lithography mirror 100 occurs. For example, the actinic light intensity of actinic light beam 520b varies depending on the overall reflectivity of the mask being exposed at a particular time, as will be further described in a subsequent figure. Thus, at time $t_1$, actinic light intensity of actinic light beam 520b has a first value as determined by reflectivity of the particular mask being used. At time $t_2$, actinic light intensity of actinic light beam 520b can have a value different from the first value at time $t_1$, as determined by reflectivity of the particular mask being used at this time period.

It should be noted that actinic light intensity sensor 525 can encroach on actinic light beam 520b as it is being reflected from mask stage 505. As a result, actinic light intensity sensor 525 can obscure a portion of a wafer (not shown) being lithographically printed. Measurement performed by actinic light intensity sensor 525 must, therefore, occur before wafer exposure. Thus, before wafer exposure, actinic light intensity sensor 525 is rotated to position 526 to obtain a measurement from actinic light beam 520b. During exposure, however, actinic light intensity sensor is in position 527 to prevent interference with actinic light beam 520b.

Figure 6:
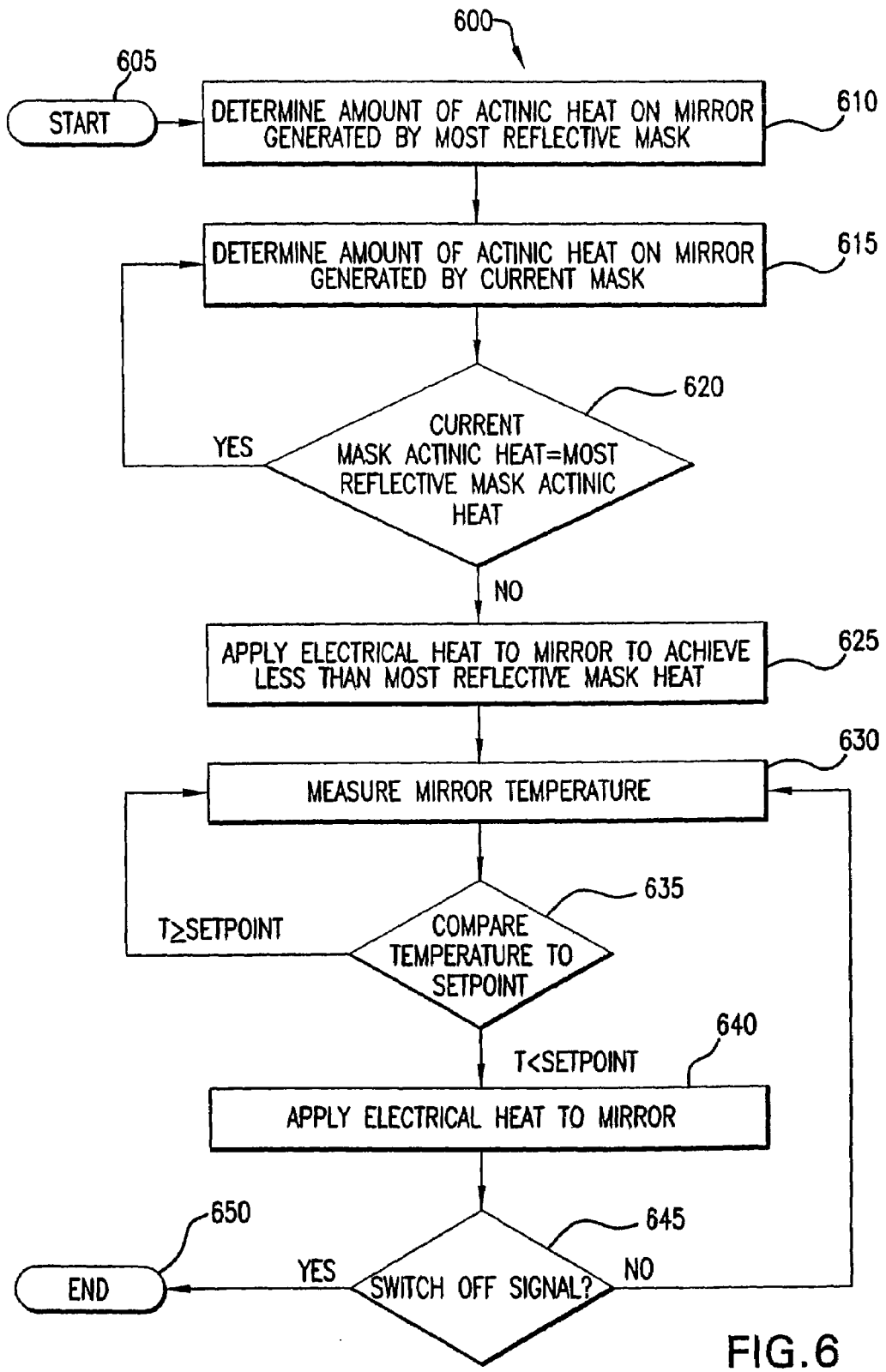
FIG. 6 is a flow diagram of the steps involved in maintaining a time-constant heat load on a lithography mirror according to the present invention.

FIG. 6 is a flow diagram 600 illustrating the steps involved in maintaining a time-constant total heat load on lithography mirror 100. Control begins with step 605 and proceeds immediately to step 610. As is known to those skilled in the relevant art(s), in a typical lithography imaging session, a plurality of masks having various reflective capabilities (i.e., heat transmission capabilities) can be used. Thus, a first mask can be capable of reflecting three watts of power while a second mask can be capable of reflecting only two watts of power, for example.

In step 610, a determination is made of the amount of actinic heat transmitted by one of the most reflective masks on lithography mirror 100 (shown in FIG. 1). One of the most reflective masks is a mask with a heat transmission capability unsurpassed by any other mask in the plurality of masks. For example, there can be four masks with a heat generation capability of five watts of actinic power. If no other mask in the plurality of masks has a heat generation capability that exceeds five watts of actinic power, each of the four masks is considered to be one of the most reflective masks. It should be noted that no additional heat (e.g., electrical heat from variable power supply 450) needs to be applied when one of the most reflective masks is being used. This mask represents the "worst case scenario" and acts as a measurement baseline for the amount of electrical heat needed when other masks are used.

In other words, the actinic heat load induced on lithography mirror 100 by one of the most reflective masks represents the desired time-constant heat load on lithography mirror 100 over time. The actinic heat transmitted by the other masks (i.e., the less reflective masks) is less than that transmitted by one of the most reflective masks. To maintain the desired time-constant heat load on lithography mirror 100, the heat load on the lithography mirror must be increased during use of the less reflective masks, by adding electrical power to the mirror.

In step 615, the amount of actinic heat transmitted by the current mask is determined.

In decision step 620, it is determined whether actinic heat transmitted by the current mask is capable of generating an amount of actinic heat equal to the actinic heat transmitted by one of the most reflective masks.

It should be noted that no accounting is made for the situation in which the actinic heat transmitted by the current mask is greater than one of the most reflective masks. Such a situation should not occur because one of the most reflective masks generates an amount of heat that is unsurpassed by any other mask in the plurality of masks.

Decision step 620 is needed to determine how much additional heat (e.g., electrical heat) needs to be applied to lithography mirror 100 to maintain the desired time-constant heat load during use of the current mask. As described above, feedforward means can be added to the lithography system to measure actinic heat transmitted by the current mask.

In decision step 620, if actinic heat from the current mask is equal to the actinic heat capable of being produced by one of the most reflective masks, then the current mask is one of the most reflective masks. Thus, no electrical heat needs to be applied to lithography mirror 100. In this situation, control returns to step 615, where an amount of actinic heat transmitted by the next mask is determined.

Alternatively, in decision step 620, if the current mask is not one of the most reflective masks, control resumes with step 625. In step 625, electrical heat is applied to lithography mirror 100 to achieve a heat load on the mirror that is slightly less (e.g., 90–95% of the value calculated from the actinic light power measured in the feedforward loop) than the heat load on the mirror during use of one of the most reflective masks. Although the mirror should be warmed as quickly as possible, recovering from a condition in which the mirror is warmed beyond "most reflective mask heat load" can cause a longer delay than could occur warming the mirror to allow its heat load to approach most reflective mask heat load. The exact difference between the heat load placed on the mirror and the heat load placed on the mirror during use of the most reflective mask depends on how accurately the heat flux sensor can measure the actinic heat input.

It should be noted that after accuracy of the system is determined (e.g., measurement, stability, and calibration), more aggressive controls can be adopted (e.g., 98–99% of the value calculated from the actinic light power measured in the feedforward loop).

For example, one of the most reflective masks can be capable of reflecting approximately three watts of power on lithography mirror 100. Thus, it would be desirable to maintain a time-constant total heat load of slightly less than three watts of power on lithography mirror 100. One of a set of less reflective masks can be capable of reflecting only one watt of power on lithography mirror 100. Thus, when using this particular mask, approximately two watts of electrical power would have to be added to lithography mirror 100 to maintain the desired time-constant total heat load on the mirror.

In embodiments, a calibration mask can be utilized to improve accuracy of the system, as would be apparent to those skilled in the relevant art(s). For example, the calibration mask would have the reflectivity of the most reflective mask. The entire active region (area of the mask normally occupied by the pattern to be transferred to the wafer with a production mask) of the calibration mask can be coated with reflective coating. The active area can then be sized to correspond to the largest active area specified for production masks to be run in the lithography tool (e.g., 108 mm×136 mm). The coating and sizing can assist in ensuring that the amount of light reflected by the calibration mask is equal to or exceeds the reflected light output of any conceivable production masks that could be run in the tool. Thus, in these embodiments, the calibration mask is the most reflective mask or one of the most reflective masks.

Determining the potential heat load transmitted by one of the most reflective masks and applying electrical heat accordingly when using one of the less reflective masks can reduce or eliminate variation in distortion of projected images. Thus, the need of having to cool lithography mirror 100 by a variable cooling means can be eliminated.

Steps 630–640 show a proportional temperature control loop technique. It would be apparent to those skilled in the art that a more sophisticated control loop could have been chosen. For example, a Proportional Integral Derivative (PID) control loop could be implemented.

In step 630, the temperature of the lithography mirror is measured. For example, this measurement can be performed by mirror temperature sensor 445. This step is performed to determine if more electrical heat needs to be applied to lithography mirror 100 to obtain or maintain the desired time-constant temperature of lithography mirror 100. For example, the Heaterstat™ control method (implemented by Minco Products, Inc. of Minneapolis, Minn.) can be used to maintain the desired time-constant temperature of lithography mirror 100. It should be noted that measuring the temperature of lithography mirror 100 also guards against the possibility of applying too much heat to the mirror such that the mirror's total heat load is greater than the desired time-constant heat load.

In step 635, the temperature of the lithography mirror is compared to a setpoint. If the mirror temperature is greater than or equal to the setpoint, control resumes with step 630, where the temperature of the mirror is measured.

Alternatively, in step 635, if the temperature is less than the setpoint, additional heat (e.g., electrical heat) is applied to the lithography mirror in step 640.

In step 645, it is determined whether the switch-off signal has been received. If the switch-off signal has not been received, control resumes with step 630, where the mirror temperature is again measured. Alternatively, in step 645, if it is determined that the switch-off signal has been received, operation of the system ceases, and control ends with step 650.

Figure 7A:
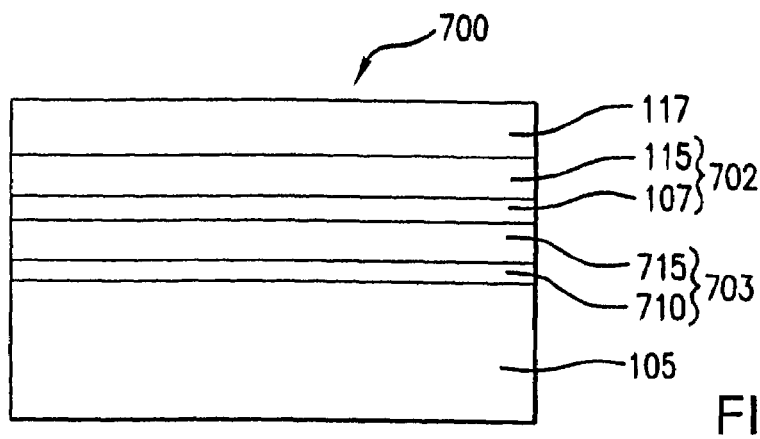
FIG. 7A is an illustration of a lithography mirror depicting a division of the mirror into zones.

FIG. 7A is an illustration of a lithography mirror 700 depicting a division of the mirror into independently controlled zones. To accommodate for lack of actinic heat in a first zone, additional heat (e.g., electrical heat) can be constantly applied to the first zone while simultaneously applied in a second zone by inversely modulating heat. Lithography mirror 700 comprises reflective layer 119 (shown in FIG. 1), polished layer 117, optical aperture zone 702, annular zone 703, and substrate 105.

Optical aperture zone 702 is the portion of lithography mirror 700 which receives and reflects light. Additional heat in optical aperture zone 702 can be independently inversely modulated according to the actinic heat load on lithography mirror 700 to reduce or eliminate variation in distortion, as described above. Optical aperture zone 702 can comprise resistive layer 107 and wiring layer 115. It should be noted that wiring layer 115 of optical aperture zone 702 is the same as that of wiring layer 115 shown in FIG. 2B.

Annular zone 703 is the portion of lithography mirror 700 which receives little or no actinic heat during operation of a lithography projection tool (known as the cold edge effect). As a result, annular zone 703 is typically cooler than optical aperture zone 702. To accommodate for its lack of actinic heat, additional heat can be constantly applied to annular zone 703.

Annular zone 703 comprises resistive layer 710 and wiring layer 715. Resistive layer 710 is the equivalent of resistive layer 107. Wiring layer 715 can couple to a power supply to provide heat to annular zone 703 of lithography mirror 700, as will be described in corresponding text of FIG. 7C.

Figure 7B:
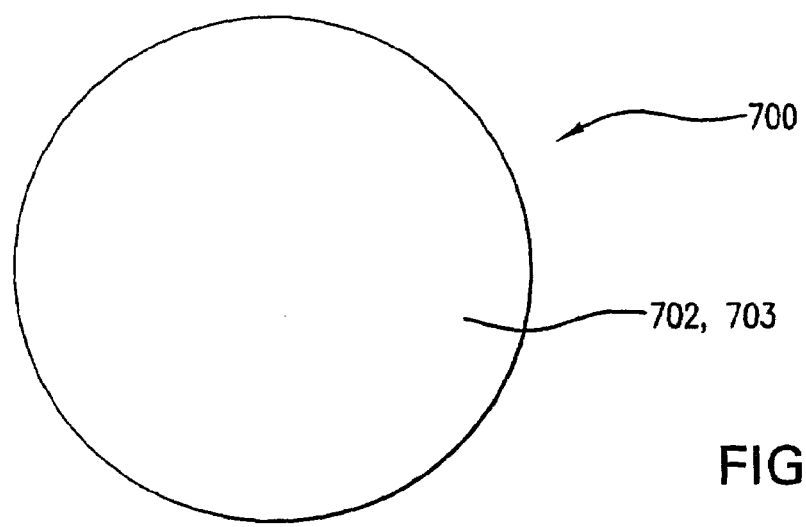
FIG. 7B is an illustration of a top view of the lithography mirror of FIG. 7A.

FIG. 7B illustrates a top view of lithography mirror 700 of FIG. 7A.

Figure 7C:
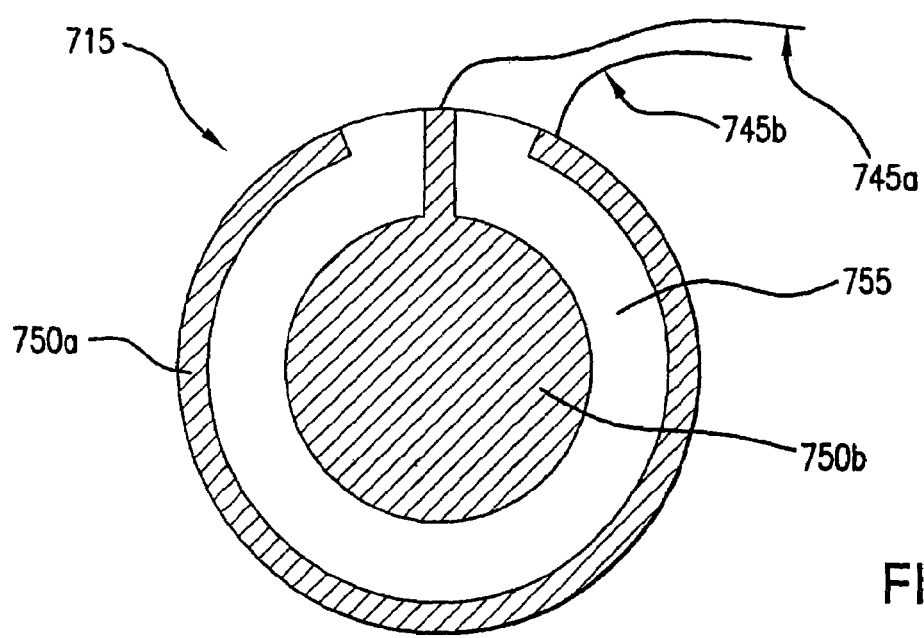
FIG. 7C is an illustration of a wiring layer of the annular zone of the lithography mirror of FIG. 7A.

FIG. 7C illustrates wiring layer 715 of annular zone 703 of FIG. 7A. Wiring layer 715 comprises contacts 750a and 750b, and insulating layer 755. Contacts 750 function in the same manner as contacts 113 (shown in FIG. 1). It should be noted, however, that in wiring layer 715 of annular zone 703, contacts 750 should be positioned concentrically such that flow of electricity between first contact 750a and second contact 750b produces a relatively annular and uniform heating pattern. Further, it should be noted that insulating layer 755 should be of the same thickness as contacts 750 to allow wiring layer 715 to be relatively flat. Insulating layer 755 functions in the same manner as insulating layer 114 (shown in FIG. 2B). Energy channels 745 (e.g., electrical wires) can be used to connect contacts 750 to an additional power supply (i.e., another power supply in addition to the one connected to wiring layer 115) located in a remote electronics cabinet in a lithography tool, as would be apparent to those skilled in the relevant art(s).

CONCLUSION

While various embodiments of the present invention have been described above, it should be understood that they have been presented by way of example, and not limitation. It will be apparent to persons skilled in the pertinent art that various changes in form and detail can be made therein without departing from the spirit and scope of the invention. Thus, the present invention should not be limited by any of the above-described exemplary embodiments, but should be defined only in accordance with the following claims and their equivalents.

It is to be appreciated that the Detailed Description section, and not the Brief Summary and Abstract sections, is intended to be used to interpret the claims. The Brief Summary and Abstract sections may set forth one or more, but not all exemplary embodiments of the present invention as contemplated by the inventor, and thus, are not intended to limit the present invention and the appended claims in any way.

What is claimed is:

1. An actinic heat load management system for mitigating a cold edge effect within a lithography mirror, comprising:

said lithography mirror including an optical aperture zone and an annular zone, wherein said optical aperture zone that includes a first resistive layer configured to heat a central portion of the mirror that receives incident electromagnetic radiation during operation;

said annular zone that includes a second resistive layer configured to heat a portion of the mirror surrounding the central portion; and wherein at least one of the first and second resistive layers is produced such that electrical conductivity of said at least one of the first and second resistive layers varies from the center thereof to its periphery.

2. The actinic heat load management system of claim 1, wherein an additional heat load is inversely modulated in the optical aperture zone according to an amount of actinic heat in the optical aperture zone and constantly applied in the annular zone to mitigate the cold edge effect.

3. The actinic heat load management system of claim 1, wherein each zone comprises:

a wiring layer formed on the respective resistive layer that includes a pair of electrodes.

4. The actinic heat load management system of claim 3, wherein each wiring layer includes an insulating sublayer and contacts for coupling to a power supply.

5. The actinic heat load management system of claim 4, further comprising at least one variable resistor coupled to the contacts of at least one zone to vary an additional heat load inversely to the actinic heat load.

6. The actinic heat load management system of claim 4, wherein the contacts in the wiring layer in the optical aperture zone are diametrically opposed to each other.

7. The actinic heat load management system of claim 4, wherein the contacts in the wiring layer in the annular zone are positioned concentrically such that a flow of electricity from a first of the contacts to a second of the contacts produces a relatively annular and uniform heating pattern.

8. The actinic heat load management system of claim 4, further comprising:

feedforward means for measuring the actinic heat load.

9. The actinic heat load management system of claim 4, further comprising feedback means for regulating at least one additional heat load applied via the contacts.

10. The actinic heat load management system of claim 1, wherein the resistive layer of at least one zone is produced by doping a semiconductor film such that electrical conductivity of the doped semiconductor film varies by increasing from the center of the doped semiconductor film to the periphery of the doped semiconductor film.

11. The actinic heat load management system of claim 1, wherein the thickness of the center of the resistive layer of at least one zone varies from the thickness at the periphery of the resistive layer, such that electrical conductivity of the resistive layer varies by increasing from the center of the resistive layer to the periphery of said resistive layer.

* * * * *